United States Patent
Duqi et al.

(10) Patent No.: US 10,549,982 B2
(45) Date of Patent: Feb. 4, 2020

(54) PRESSURE SENSOR ENCAPSULATED IN ELASTOMERIC MATERIAL, AND SYSTEM INCLUDING THE PRESSURE SENSOR

(71) Applicant: STMICROELECTRONICS S.R.L., Agrate Brianza (IT)

(72) Inventors: Enri Duqi, Milan (IT); Bruno Murari, Monza (IT); Sebastiano Conti, Pregnana Milanese (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/884,624

(22) Filed: Jan. 31, 2018

(65) Prior Publication Data

US 2018/0148316 A1    May 31, 2018

Related U.S. Application Data

(63) Continuation-in-part of application No. 15/337,701, filed on Oct. 28, 2016, now abandoned.

(30) Foreign Application Priority Data

Feb. 15, 2016  (IT) ........................ 102016000015081

(51) Int. Cl.
*H01L 29/82* (2006.01)
*B81B 3/00* (2006.01)
*B81B 7/00* (2006.01)

(52) U.S. Cl.
CPC .......... *B81B 3/0021* (2013.01); *B81B 3/0094* (2013.01); *B81B 7/0041* (2013.01); *B81B 2201/0264* (2013.01)

(58) Field of Classification Search
CPC ............ H01L 2924/1461; H01L 29/84; H01L 41/1132; H01L 41/1138
USPC ........................................................ 257/419
See application file for complete search history.

(56) References Cited

U.S. PATENT DOCUMENTS

| | | | |
|---|---|---|---|
| 4,276,533 A | 6/1981 | Tominaga et al. | |
| 4,445,383 A | 5/1984 | Binder et al. | |
| 4,823,605 A | 4/1989 | Stein | |
| 4,842,685 A | * 6/1989 | Adams ................ | G01L 19/0084 |
| | | | 156/293 |
| 5,090,247 A | 2/1992 | Liebgen | |

(Continued)

FOREIGN PATENT DOCUMENTS

| | | |
|---|---|---|
| CN | 102052988 A | 5/2011 |
| DE | 102004035545 A1 | 2/2006 |

(Continued)

OTHER PUBLICATIONS

European Office Action, dated Jun. 14, 2011, for European Application No. 05 425 183.0, 4 pages.

(Continued)

*Primary Examiner* — Theresa T Doan
(74) *Attorney, Agent, or Firm* — Seed Intellectual Property Law Group LLP

(57) ABSTRACT

A packaged pressure sensor, comprising: a MEMS pressure-sensor chip; and an encapsulating layer of elastomeric material, in particular PDMS, which extends over the MEMS pressure-sensor chip and forms a means for transferring a force, applied on a surface thereof, towards the MEMS pressure-sensor chip.

23 Claims, 6 Drawing Sheets

(56) References Cited

U.S. PATENT DOCUMENTS

| | | |
|---|---|---|
| 5,596,219 A | 1/1997 | Hierold |
| 5,661,245 A | 8/1997 | Svoboda et al. |
| 5,830,372 A | 11/1998 | Hierold |
| 5,844,287 A | 12/1998 | Hassan et al. |
| 6,115,030 A | 9/2000 | Berstis et al. |
| 6,195,082 B1 | 2/2001 | May et al. |
| 6,472,244 B1 | 10/2002 | Ferrari et al. |
| 6,504,253 B2 | 1/2003 | Mastromatteo et al. |
| 6,546,799 B1 | 4/2003 | Vigna et al. |
| 6,627,965 B1 | 9/2003 | Tuller et al. |
| 6,640,642 B1 | 11/2003 | Onose et al. |
| 6,838,362 B2 | 1/2005 | Mastromatteo et al. |
| 6,945,115 B1 | 9/2005 | Wang |
| 7,352,356 B2 | 4/2008 | Roberts et al. |
| 7,474,296 B2 | 1/2009 | Obermeyer et al. |
| 2002/0006682 A1 | 1/2002 | Benzel et al. |
| 2002/0137348 A1 | 9/2002 | Mlcak |
| 2002/0143484 A1 | 10/2002 | Chiesa |
| 2003/0119220 A1 | 6/2003 | Mlcak et al. |
| 2003/0168711 A1 | 9/2003 | Villa et al. |
| 2003/0205090 A1 | 11/2003 | Jakobsen |
| 2004/0007750 A1 | 1/2004 | Anderson et al. |
| 2004/0079159 A1 | 4/2004 | Muchow |
| 2004/0103724 A1 | 6/2004 | Takizawa et al. |
| 2004/0112138 A1 | 6/2004 | Knirck et al. |
| 2004/0118214 A1 | 6/2004 | McDonald et al. |
| 2004/0224482 A1 | 11/2004 | Kub et al. |
| 2004/0237658 A1 | 12/2004 | Ohms et al. |
| 2004/0237661 A1 | 12/2004 | Yang |
| 2004/0238821 A1 | 12/2004 | Yang |
| 2004/0251906 A1 | 12/2004 | Staple et al. |
| 2005/0000292 A1 | 1/2005 | Muchow et al. |
| 2005/0132815 A1 | 6/2005 | Claude et al. |
| 2005/0199971 A1 | 9/2005 | Anderson et al. |
| 2005/0208696 A1 | 9/2005 | Villa et al. |
| 2005/0219220 A1 | 10/2005 | Kishi et al. |
| 2005/0252301 A1 | 11/2005 | Dietrich |
| 2006/0082463 A1 | 4/2006 | Sri-Jayantha et al. |
| 2006/0185429 A1* | 8/2006 | Liu .................. B60C 23/0408 73/146.5 |
| 2006/0201255 A1 | 9/2006 | Czarnocki |
| 2006/0262088 A1 | 11/2006 | Baldo et al. |
| 2008/0013102 A1 | 1/2008 | Berger et al. |
| 2008/0208425 A1 | 8/2008 | Riccoti et al. |
| 2011/0036174 A1 | 2/2011 | Hooper et al. |
| 2011/0260266 A1 | 10/2011 | Han et al. |
| 2011/0274299 A1 | 11/2011 | Shaw et al. |
| 2012/0106095 A1* | 5/2012 | Daniel ................ H05K 1/0283 361/746 |
| 2015/0234499 A1* | 8/2015 | Hu ........................ G06F 3/044 345/174 |
| 2015/0369680 A1 | 12/2015 | Ashino |

FOREIGN PATENT DOCUMENTS

| | | |
|---|---|---|
| EP | 1707931 A1 | 10/2006 |
| EP | 1069419 B1 | 1/2007 |
| EP | 1324382 B1 | 3/2007 |
| EP | 1378736 B1 | 12/2007 |
| JP | 62059825 A | 3/1987 |
| JP | 2001174350 A | 6/2001 |
| WO | 9825115 A1 | 6/1998 |
| WO | 0068930 A1 | 11/2000 |
| WO | 2007010570 A1 | 1/2007 |

OTHER PUBLICATIONS

Dow Corning Electronics Solutions, "Information About *Dow Corning®* Brand Dielectric Gels," Product Information, © 2002, 2003, 2004 Dow Corning Corporation, Form No. 10-905E-01, 8 pages.

Lal et al., "MEMS: Technology, Design, CAD and Applications," IEEE Computer Society, Proceedings of the 15$^{th}$ International Conference on VLSI Design, 2002, 2 pages.

Sugiyama et al., "A32×32 (1k)-Element Silicon Pressure-Sensor Array with CMOS Processing Circuits," *Electronics and Communications in Japan, Part II: Electronics* 75:64-75 1992, 13 pages.

* cited by examiner

PRESSURE SENSOR ENCAPSULATED IN ELASTOMERIC MATERIAL, AND SYSTEM INCLUDING THE PRESSURE SENSOR

BACKGROUND

Technical Field

The present disclosure relates to a packaged pressure sensor, to an assembly including the packaged pressure sensor, to a system including the packaged pressure sensor and to a method of making the packaged pressure sensor.

Semiconductor pressure sensors operate by detecting a pressure acting on a thin membrane, or diaphragm, of silicon suspended over a semiconductor body. Assembly of the semiconductor body and of the membrane defines a cavity for deflection of the membrane when a force acts thereon.

Currently, sensors are known that are able to measure high pressure values and are provided with a core of stainless steel, fixed on which are strain-gauge elements. The strain-gauge elements detect the geometrical deformation of the core to which they are associated by variations of electrical resistance. However, these sensors, for reasons of reliability, size, and costs are not very convenient to use in automotive applications. Furthermore, they do not provide high precision.

There are likewise known integrated pressure sensors, obtained with the semiconductor technology. These sensors typically comprise a thin membrane, or diaphragm, suspended over a cavity provided in a silicon body. Formed within the membrane are piezoresistive elements connected together to form a Wheatstone bridge. When subjected to a pressure, the membrane undergoes deformation, causing a variation of resistance of the piezoresistive elements, and thus an unbalancing of the Wheatstone bridge. As an alternative, capacitive sensors are available, where the membrane provides a first plate of a capacitor, whereas a second plate is provided by a fixed reference. During use, deflection of the membrane generates a variation of the capacitance of the capacitor, which may be detected and associated to the pressure exerted on the membrane.

However, these semiconductor sensors may not in themselves be used for measuring high pressures in so far as they typically have low full-scale values. Thus, for high-pressure applications, an appropriate packaging is to be provided for the aforesaid semiconductor pressure sensors. For instance, materials used for the packaging include steel, stainless steel, ceramic. In particular, some pressure sensors are arranged in containers of ceramic or steel having a base area much larger than the sensitive area of the semiconductor pressure sensor. Then, these containers are filled with oil for ensuring an extensive surface for application of the force to be measured and a uniform distribution of the force itself. However, use of oil requires the container to be fluid-tight and, in addition to involving high costs, limits the field of application thereof.

BRIEF SUMMARY

Embodiments described herein are directed a packaged pressure sensor, an assembly including the packaged pressure sensor, a system including the packaged pressure sensor and a method of making the packaged pressure sensor.

BRIEF DESCRIPTION OF THE SEVERAL VIEWS OF THE DRAWINGS

For a better understanding of the disclosure, some embodiments thereof will now be described, purely by way of non-limiting example and with reference to the attached drawings, wherein.

DETAILED DESCRIPTION

Figure 1:
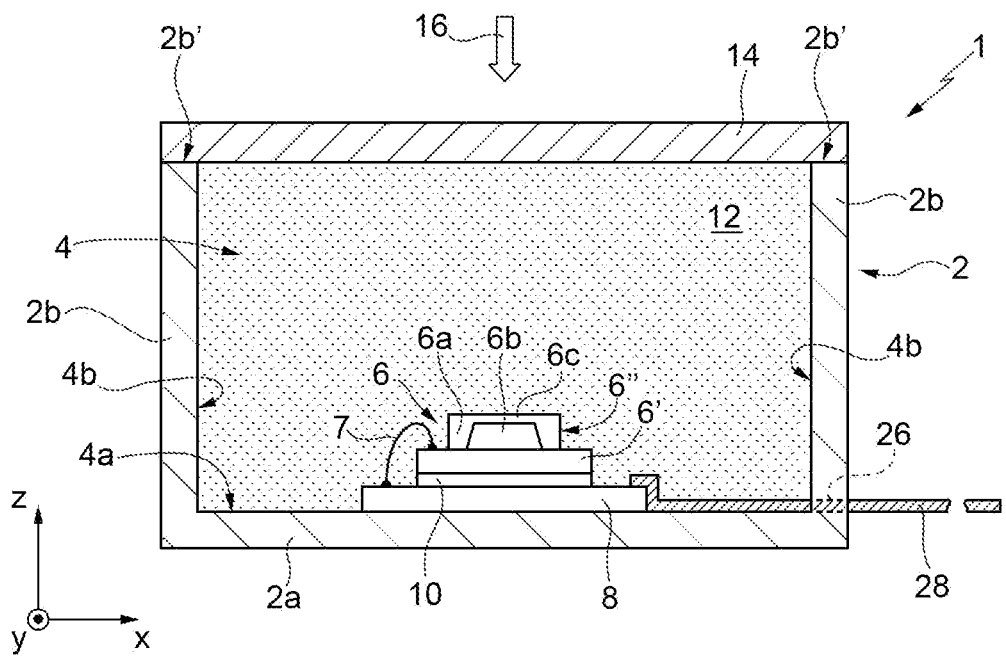
FIG. 1 is a cross-sectional view of a packaged pressure sensor according to an aspect of the present disclosure.

FIG. 1 shows, in lateral section in a plane of coordinates X, Y, Z, a packaged pressure sensor 1, according to an embodiment of the present disclosure. In the following description, the term "pressure sensor" should be intended to encompass also the term "force sensor", being the force and the pressure related by the formula P=F/A (i.e., pressure is force F divided by area A), or equivalently F=P·A. The terms "pressure sensor" and "force sensor" may therefore be used in an interchangeable way.

Figure 2:
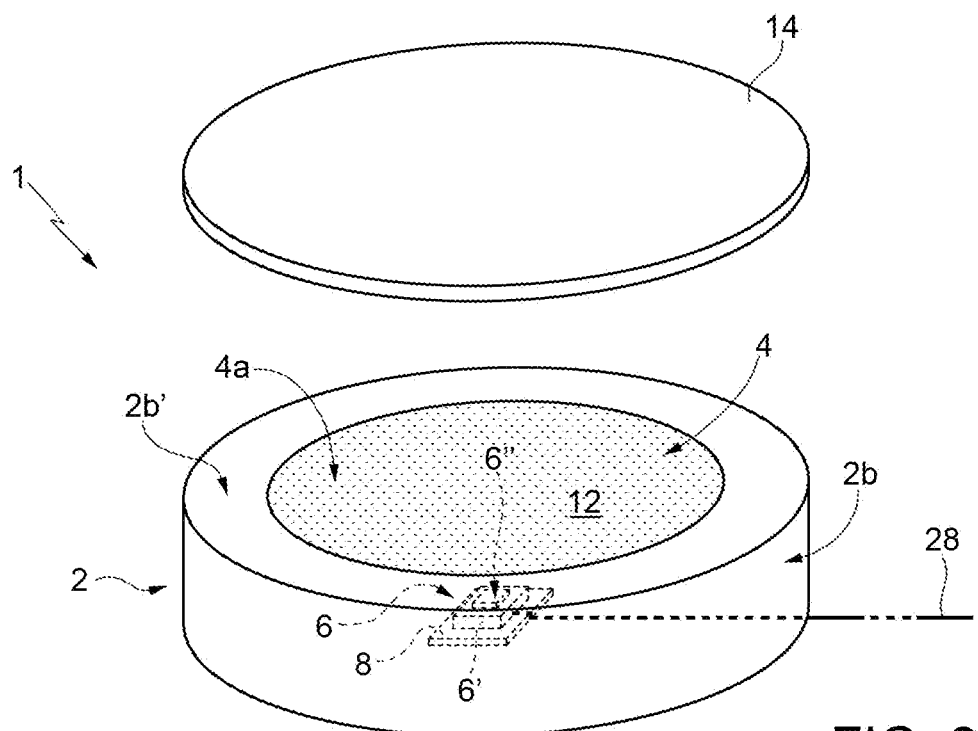
FIG. 2 is a partially exploded perspective view of the packaged pressure sensor of FIG. 1.

FIG. 2 is a partially exploded perspective view of the packaged pressure sensor of FIG. 1.

The pressure sensor 1 comprises a container 2 having a bottom wall 2a and one or more lateral walls 2b (in FIG. 2, one single circularly-shaped lateral wall 2b is shown). The lateral walls 2b and the bottom wall 2a may be a monolithic structure (as shown in FIG. 1) or alternatively a plurality of isolated components coupled together. The lateral walls 2b have a top surface 2b' whose extension is defined by the thickness of the lateral walls 2b. A cavity 4 extends in the container 2, inferiorly delimited by an internal side 4a of the bottom wall 2a and laterally delimited by internal sides 4b of the lateral walls 2b. The top surface 2b' of the lateral walls 2b lies parallel to the XY plane and, in a top view, surrounds the cavity 4.

A sensor chip 6, e.g. including micromachined sensing elements, is housed in the cavity 4.

The container 2 may be of any suitable material, such as steel, stainless steel, ceramic, or metal alloys with low coefficient of thermal expansion (e.g., iron alloys with nickel and cobalt, the chemistry of which is controlled for presenting characteristics of low and uniform thermal expansion). In greater detail, the sensor chip 6 is coupled to the internal side 4a of the bottom wall 2a of the container 2, either directly or by further elements therebetween as illustrated in FIG. 1 and described in what follows. The sensor chip 6 is of a per se known type, and includes an application specific integrated circuit (ASIC) 6', mounted on which is a pressure sensor 6" formed using micro-electro-mechanical system (MEMS) technology, and is herein referred to as a MEMS sensor 6".

The MEMS sensor 6" and the ASIC 6' may be electrically coupled in any known manner, for example through conductive wires (wire bonding), or solder balls, or any other suitable means.

The MEMS sensor 6" of the sensor chip 6 includes, in particular, a semiconductor body 6a (e.g., silicon) defining a cavity 6b suspended over which is a membrane (or diaphragm) 6c, which is also, for example, of silicon. The membrane 6c is typically obtained with micromachining steps that include photolithographic and of wet-etching or dry-etching processes. The membrane 6c is configured to deflect towards the cavity 6b under the action of a force that acts thereon. In or on the membrane 6c one or more piezoresistive elements (not illustrated in the figure) are formed, for example four piezoresistors may be connected together to form a Wheatstone bridge. When subjected to pressure, the membrane 6c undergoes deformation, causing a variation of resistance of the piezoresistive elements and thus an unbalancing of the Wheatstone bridge, which may be measured and correlated to the value of pressure acting on the MEMS sensor. The piezoresistive elements are, in particular, arranged at the vertices of an ideal cross centered at the center of the membrane 6c, and constituted regions with a doping of a P type. The piezoresistive elements may be obtained via diffusion of dopant atoms through an appropriate diffusion mask, and have, for example, an approximately rectangular cross-section. As an alternative to the Wheatstone-bridge connection, the piezoresistive detection elements may form part of a ring oscillator circuit.

According to a different embodiment, the sensor chip 6 operates capacitively as is well known in the art. In this case, no piezoresistive elements are present.

Generally described the ASIC 6' is semiconductor die includes one or more electrical components, such as integrated circuits. The semiconductor die is made from a semiconductor material, such as silicon, and includes an active surface in which integrated circuits are formed. The integrated circuits may be analog or digital circuits implemented as active devices, passive devices, conductive layers, and dielectric layers formed within the semiconductor die and electrically interconnected according to the electrical design and function of the semiconductor die. The ASIC 6' is configured to communicate with the MEMS sensor 6" by sending signals thereto and receiving signals therefrom.

The sensor chip 6 is coupled, through the ASIC, to a printed-circuit board (PCB) 8 by a coupling region 10, for example formed by an adhesive tape, such as a thin film of polyimide, or otherwise by soldering regions. In the case of use of an adhesive film, the ASIC 6' is electrically coupled to the PCB 8 with one or more conductive wires 7. The sensor chip 6 and the PCB 8 are thus stacked on top of one another. The PCB 8 lies on the bottom 4a of the internal cavity 4 of the container 2, and is coupled to the bottom 4a by a layer of glue or of an adhesive tape, or layers of temperature-stable polyamide.

The PCB 8 may be one of a flexible PCB, a rigid PCB, an epoxy PCB, a ceramic PCB, or even else, according to the needs.

It is noted that, according to an aspect of the present disclosure, an interface element, such as an organic substrate, or a ceramic substrate, provided with solder pads (for example a BGA—"Ball Grid Array") may be arranged between the ASIC 6' and the PCB 8. In this case, the ASIC 6' is coupled to the BGA and the BGA is coupled to the PCB 8. The interface element is not explicitly shown in the drawings. The ASIC integrates the functions of conditioning of the analog signal with amplification and digitization for offering a digital interface that is robust against disturbance. The PCB 8 integrates the functions of mechanical support and of interface and routing for the electrical connections.

A polydimethylsiloxane (PDMS) filling layer 12 completely fills the internal cavity 4, surrounding the sensor chip 6 and the PCB 8. The filling layer 12 extends in contact with the membrane 6c of the sensor chip 6, but not in the internal cavity 6b, which is insulated so as not to jeopardize the functions of the sensor chip 6. PDMS may be replaced by another elastomeric material, such as for example generic silicone rubbers, polymeric elastomers, silicone gels. In the sequel of the present description, explicit reference will be made to PDMS, without this implying any loss of generality.

The container 2 further comprises a covering cap 14, configured to be directly or indirectly coupled to the top surface 2b' of the lateral walls 2a so as to delimit the cavity 4 at the top. Therefore, when mounted, the covering cap 14 closes the cavity 4, and, when the cavity 4 is filled with the filling layer 12, it is in direct contact with said filling layer 12.

According to one embodiment, the internal cavity 4 has a volume comprised between $10^{-6}$ m$^3$ and $10 \cdot 10^{-6}$ m$^3$, for example $2 \cdot 10^{-6}$ m$^3$. More in particular, the aforesaid volume is defined by an area of the internal side 4a of the bottom wall 2a, lying in the plane XY, of a value comprised between $10^{-5}$ m$^2$ and $10^{-3}$ m$^2$, for example $3 \cdot 10^{-4}$ m$^2$, and lateral walls 2b having a main extension, along Z, of a value comprised between 1 mm and 20 mm, for example 5 mm. The cap 14 has a base area of a value comprised between $10^{-5}$ m$^2$ and $10^{-3}$ m$^2$, for example $3 \cdot 10^{-4}$ m$^2$, and a thickness, measured along Z, equal to one millimeter or a few millimeters, for example between 1 mm and 5 mm, in particular between 1 mm and 2 mm, for example 1.5 mm.

PDMS is introduced into the internal cavity 4, in liquid form and in the absence of gas bubbles and is then made to solidify, in a per se known manner, for example during a curing step at high temperature, e.g., at least 100° C. for some minutes (e.g., 10-20 min).

In order to ensure complete filling of the cavity 4 and at the same time a contact between the cap 14 and the filling layer 12, it is preferable to fill the internal cavity 4 after mounting of the cap 14, through an appropriate hole made through the container 2. Given the viscosity of PDMS and the subsequent step of solidification thereof, the present applicant has found that there are no problems of significant exit, or spread, of PDMS out from the hole used for its introduction. Furthermore, said hole may be plugged or soldered in a per se known manner.

During use, when a pressure, or force, is applied on the cap 14 (in the direction of the arrow 16 in FIG. 1), any deflection of the cap 14 in the direction Z is transferred to the filling layer 12, which in turn transfers the pressure to the membrane 6c of the sensor chip 6, which functions as transducer, converting the deflection undergone by the membrane 6c into a electrical signal processed by the ASIC 6' and supplied to the PCB 8. The force applied on the packaged pressure sensor 1 is thus detected by the sensor chip 6. The packaged pressure sensor 1 is able to measure forces, applied in the direction indicated by the arrow 16, in the range 0.1-100 kN.

The present applicant has found that PDMS is designed to transfer the force applied to the cap 14 with high directionality and is thus suited to the application in the context described.

The cap 14 further offers a surface of application of the force 16 that is more extensive than that offered by the membrane 6c of the sensor chip 6 and more uniform than that offered by the PDMS layer in the absence of the cap 14. In use, thus, the cap 14 acts as pressure demultiplier, increasing the area of application of the force, and rendering it uniform.

As has been said, PDMS, when subject to compression, propagates the force applied thereto with good directionality along the line of action of the force. Thus, a sensor chip 6 arranged along the line of action of the force applied is subject to a force greater than a sensor chip arranged laterally with respect to the line of action of the force. Likewise, what has been said applies to a sensor chip 6 arranged in the proximity of the cap 14, which will be subject to a force of intensity greater than a sensor chip arranged in the proximity of the bottom of the container 2.

Figure 3:
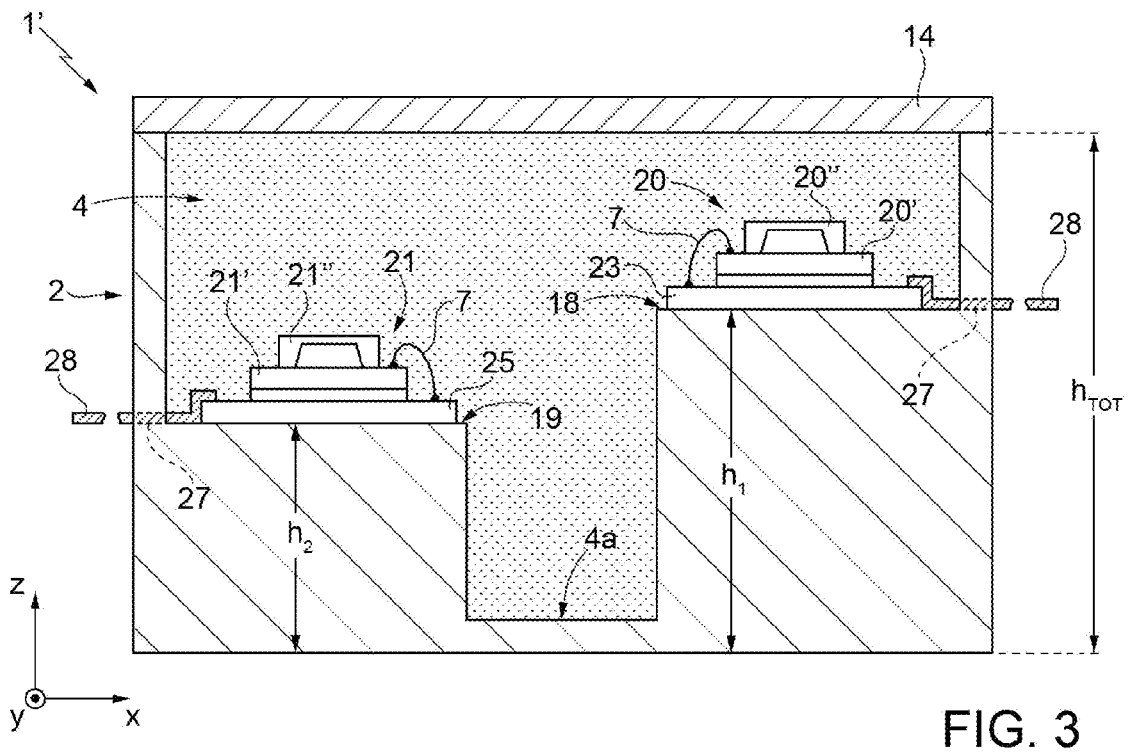
FIGS. 3 and 4 are cross-sectional views of respective packaged pressure sensors according to respective embodiments of the present disclosure.

In this regard, as illustrated in FIG. 3, which shows a packaged pressure sensor 1' according to a further embodiment, it is possible to shape the internal cavity 4 of the container 2 for presenting first and second resting regions 18, 19, where the first resting region extends in the plane XY to a height $h_1$, measured along Z starting from the bottom 4a of the cavity 4, greater than the height $h_2$ to which the second resting region 19 extends. In any case, the values of $h_1$ and $h_2$ are smaller than the maximum depth $h_{TOT}$, along Z, of the cavity 4. By way of example, the value of $h_{TOT}$ is chosen between 1 mm and 20 mm, for example 5 mm; the value of $h_1$ is chosen between 1 mm and 20 mm, for example 15 mm; the value of $h_2$ between 1 mm and 5 mm, for example 1 mm. The second resting region 19 may, in one embodiment, coincide with the internal side 4a of the bottom wall 2a.

Each first and second resting region 18, 19 houses a respective sensor chip 20, 21 coupled to a respective PCB 23, 25. Each sensor chip 20, 21 is similar to the sensor chip 6 (it comprises, that is, an ASIC 20', 21' and a MEMS 20", 21") and thus is not described further herein in the interest of brevity.

Figure 4:
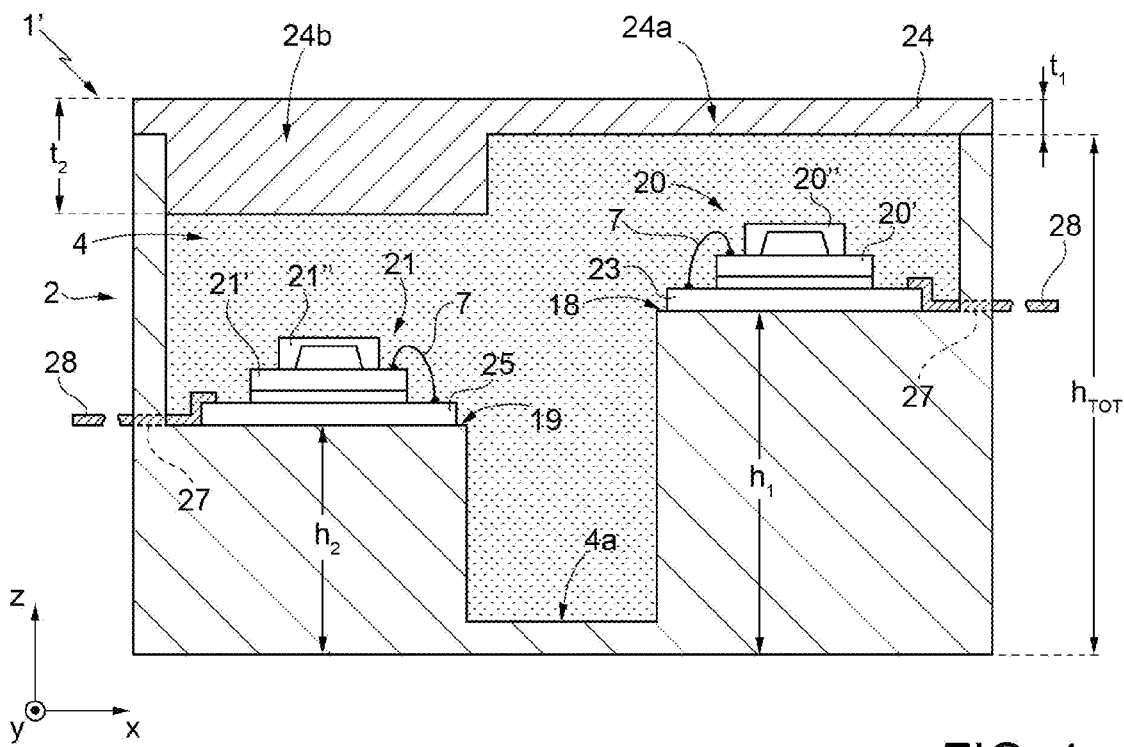

According to a further embodiment, illustrated in FIG. 4, a packaged pressure sensor 1" comprises a cap 24 shaped for having thicknesses $t_1$, $t_2$ different from one another (in particular, $t_1$ smaller than $t_2$) in the first resting region 18 and second resting region 19, respectively. In this way, in use, when a force of pressure acts on the cap 24 from outside, a thin region 24a, having a thickness $t_1$, of the cap 24 will undergo a deflection greater than a thick region 24b thereof, having a thickness $t_2$. Consequently, transmission of this pressure to the PDMS layer 4 will be more accentuated in the thin region 24a of the cap 24 than in the thicker regions 24b thereof.

For instance, the thin region 24a of the cap 24 has a thickness $t_1$, measured along Z, comprised between 1 and 5 mm, in particular between 2 and 3 mm; the thick region 24b has a thickness $t_2$, measured along Z, greater than that of the thin region 24a, for example greater by one order of magnitude (between 10 and 50 mm), in particular between 20 and 30 mm.

With reference to both of the embodiments of FIGS. 3 and 4, both of the sensor chips 20 and 21 detect, in use, a pressure variation generated by the variation in temperature of the filling layer 12, which expands and is compressed as a function of the operating temperature. The signal generated by each sensor chip on account of the variation of temperature is a noise signal that adds to the useful signal represented by the variation of pressure due to the external force to be detected. In the case of FIGS. 3 and 4, however, the sensor chip 21 is minimally subject to the pressure generated by the external force to be detected, for the reasons set forth above. It may thus be used as reference for monitoring the temperature-noise signal, which may be subtracted, by an appropriate processing system external to the pressure sensor 1', 1", from the pressure signal supplied by the sensor chip 20.

Irrespective of whether the embodiment of FIG. 1, FIG. 3, or FIG. 4 is considered, each sensor chip contained in the cavity 4 communicates with the respective PCB 8, 23, or 25 on which it is mounted, and said PCB 8, 23, 25 communicates with the outside of the packaged pressure sensor by a respective hole 26 (in FIG. 1) or holes 27 (in FIGS. 3 and 4) made through the container 2, through which there pass one or more electrical wires, designated as a whole by the reference 28. The one or more electrical wires are in direct electrical contact with the sensor chip 6 and/or with the PCB 8, and/or in electrical contact with the sensor chip 6 via the PCB 8. The hole 26 or holes 27, in the respective embodiments, have a diameter of a size such as to enable passage of the electrical wires 28 but not exit of PDMS in liquid form during filling of the cavity 4. In any case, since PDMS is viscous, any exit thereof in significant amounts is unlikely; further, since it is solidified immediately after it has been poured, any possible exit thereof does not jeopardize proper operation of the packaged pressure sensor.

According to a further aspect of the present disclosure, the PCB 8 may be a flexible PCB. In this case, at least one of the electrical wires 28 may a portion of the flexible PCB 8 extending through the container 2.

It is evident that the container 2, like the internal cavity 4, may be modeled according to the need, on the basis of the specific application of use of the packaged pressure sensor. The container 2, and/or the cavity 4, may consequently have a quadrangular or generically polygonal shape, a toroidal shape, or any other shape. Further, it is evident that it may house any number of sensor chips. Furthermore, in the case where a plurality of sensor chips are present in the cavity 4, they may share a same PCB, for example using a flexible circuit board (FCB) that may be modeled for respecting the internal conformation of the cavity 4.

Figure 5:
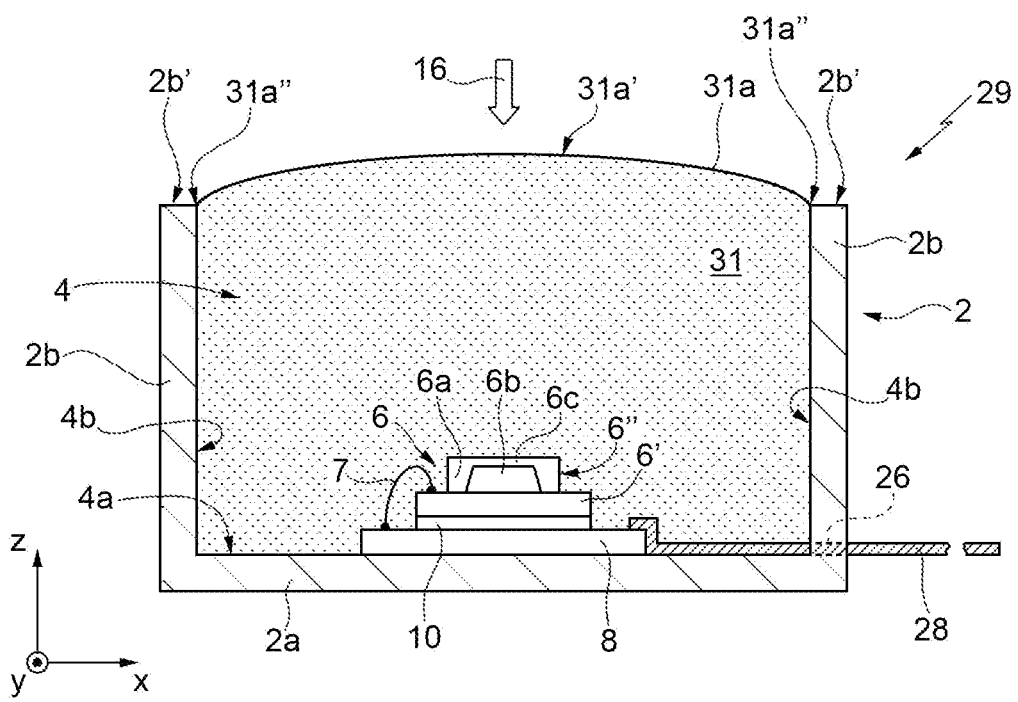
FIG. 5 is a cross-sectional view of a packaged pressure sensor according to another aspect of the present disclosure.

FIG. 5 shows a further embodiment of a packaged pressure sensor 29 according to a further aspect of the present disclosure. Elements of the pressure sensor 29 which are the same as elements of the pressure sensor 1 are indicated with the same reference numerals and not further described in detail. In particular, it is noted that the interface element (e.g., a BGA) between the ASIC 6' and the PCB 8, disclosed with reference to FIG. 1, may be present also in the embodiment of FIG. 5, even if not explicitly shown in the drawing.

The pressure sensor 29 comprises the container 2, in particular made of ceramic material. However, the container 2 may also be of stainless steel or metal alloys such as iron alloys with nickel and cobalt (e.g., the chemistry of which is controlled for presenting characteristics of low and uniform thermal expansion). The container 2 defines the internal cavity 4, where the sensor chip 6 is housed. The sensor chip 6 is coupled to the internal side 4a of the bottom wall 2a of the container 2 in the internal cavity 4, either directly or by further elements therebetween as illustrated in FIG. 5 and already described in FIG. 1. The sensor chip 6 is of a per se known type, and includes the application specific integrated circuit (ASIC) 6', mounted on which is a pressure sensor obtained using micro-electromechanical sensor (MEMS) technology 6", referred to herein as a MEMS sensor 6". The sensor chip 6 may operate capacitively or piezoresistively.

The sensor chip 6 is coupled, through the ASIC 6', to the printed-circuit board 8 by the coupling region 10, for example formed by an adhesive tape, such as a thin film of polyimide, or otherwise by soldering regions. In an embodiment, the ASIC integrates the functions of conditioning of the analog signal with amplification and digitization for offering a digital interface that is robust against disturbance, while the PCB 8 integrates the functions of mechanical support and of interface and routing for the electrical connections.

A polydimethylsiloxane (PDMS) filling layer 31 (analogous to the filling layer 12 previously discussed) completely fills the internal cavity 4, surrounding the sensor chip 6 and the PCB 8. The filling layer 31 extends in contact with the membrane 6c of the sensor chip 6, but not in the internal cavity 6b, which is insulated so as not to jeopardize the functions of the sensor chip 6. PDMS may be replaced by another elastomeric material, such as for example generic silicone rubbers, polymeric elastomers, silicone gels. In the sequel of the present description, explicit reference will be made to PDMS, without this implying any loss of generality.

In the embodiment of FIG. 5 a covering cap, such as the covering cap 14 of FIGS. 1 and 3, is not present. Instead, the filling layer 31 extends at a height, along Z direction, which is at least the same as the height, along Z direction, of the lateral walls of the container 2. Preferably, the filling layer 31 extends at a height which is higher than that of the lateral walls 2b of the container 2. Accordingly, the cavity 4 is not delimited, nor covered, at its top, and the filling layer 31 is directly exposed to the environment.

As shown in FIG. 5, according to an embodiment of the present disclosure, the filling layer 31 has a curved, or convex, profile; in other words, a top surface 31a of the filling layer may have a dome-like shape whose central portion 31a' effectively extends at a height which is higher, along Z, than that of peripheral portions 31a" of the filling layer 31; more in particular, according to the embodiment of FIG. 5, the filling layer 31 has a height, at peripheral portions 31a" adjacent to the lateral walls 2b of the container 2, which is about the same as that of the lateral walls 2b of the container 2. Therefore, according to this embodiment, the filling layer 31 does not cover the top surface 2b' of the lateral walls 2b.

Figure 6:
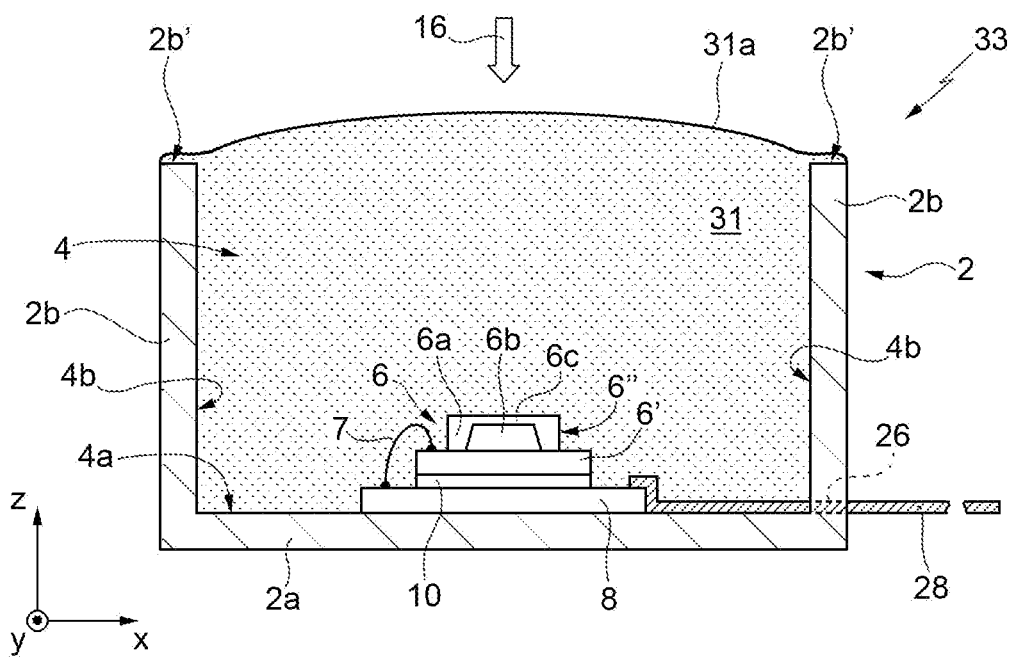
FIG. 6 is a cross-sectional view of a packaged pressure sensor according to a further aspect of the present disclosure.

FIG. 6 shows a further embodiment of a packaged pressure sensor 33 according to a further aspect of the present disclosure. Elements of the pressure sensor 33 which are common to the pressure sensor 1 and/or the pressure sensor 29 are identified using the same reference numerals, and not further described.

In the pressure sensor 33, the filling layer 31 extends at least in part on the top surface 2b' of the lateral walls 2b. In particular, the filling layer 31 extends on the top surface 2b' of the lateral walls 2b in such a way to completely cover the top surface 2b'.

In this case, the top surface of the filling layer 31 may have a curved, or convex, profile (dome-like top surface 31a); or alternatively the filling layer 31 may be modeled (e.g., through a cutting step) so as to have a planar or substantially planar top surface 31a.

With reference to both FIG. 5 and FIG. 6, during use, a pressure, or force, is directly applied to the filling layer 31 (i.e., on at least a superficial portion of the top surface 31a), in the direction of the arrow 16 in FIGS. 5, 6.

Any deflection of the filling layer 31 in the direction Z is transferred to the membrane 6c of the sensor chip 6, which functions as transducer, converting the deflection undergone by the membrane 6c into an electrical signal processed by the ASIC 6' and supplied to the PCB 8. The force applied on the filling layer 31 is thus detected by the sensor chip 6. The pressure sensor 29 and the pressure sensor 33 are able to measure forces, applied in the direction indicated by the arrow 16, in the range 1-100 N.

The teaching put forward with reference to FIGS. 5 and 6 may be likewise applied to the embodiments of FIGS. 3 and 4. In this case, the packaged pressure sensors 1' do not include the cap 14 and 24 and the filling layer is directly exposed to the force, or pressure, applied to it.

Figure 7:
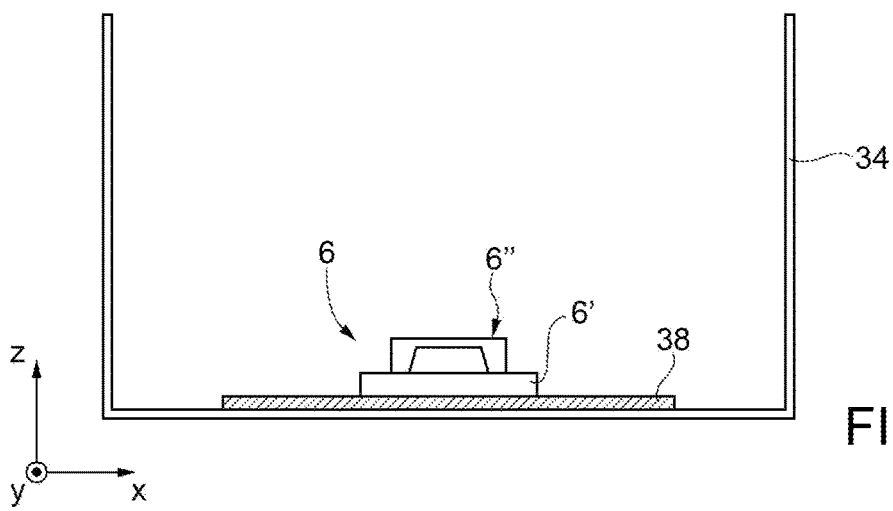
FIGS. 7-9 are cross-sectional views regarding steps for manufacturing a packaged pressure sensor according to a further embodiment of the present disclosure.
Figure 8:
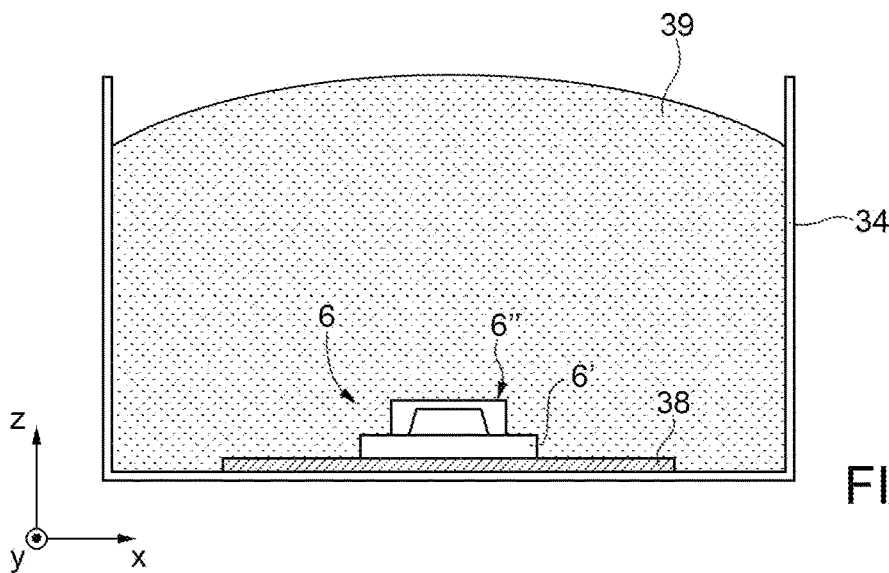
Figure 9:
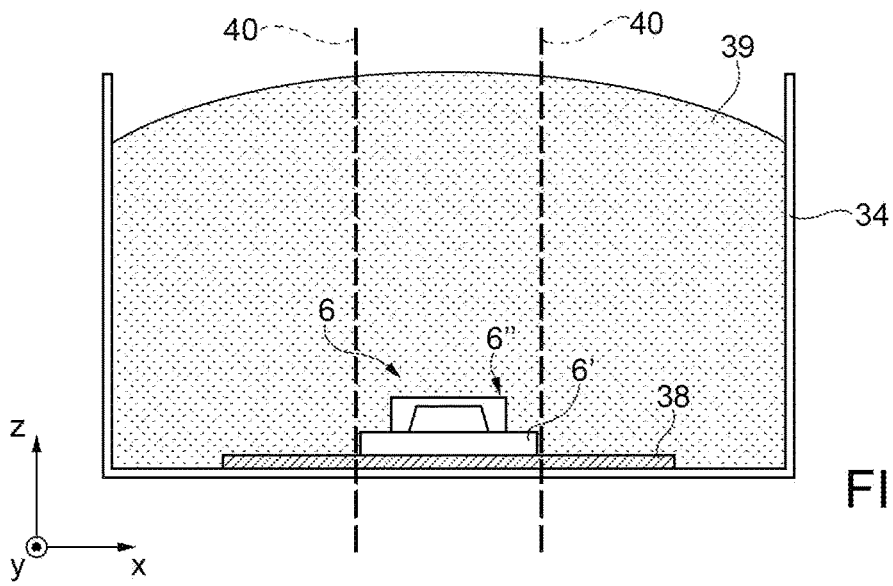
Figure 10A:
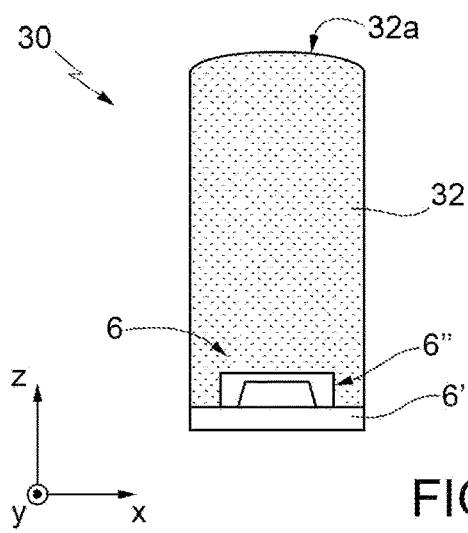
FIG. 10A is a cross-sectional view of an embodiment of a packaged pressure sensor provided according to the steps of FIGS. 7-9.
Figure 10B:
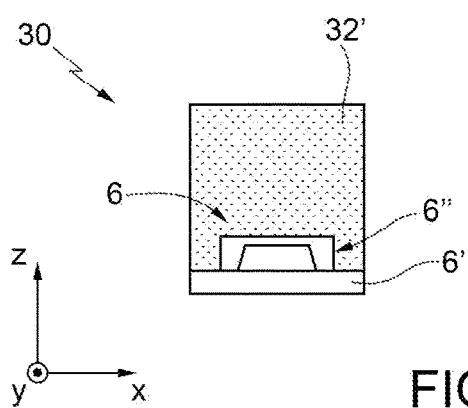
FIG. 10B is a cross-sectional view of an alternative embodiment of a packaged pressure sensor provided according to the steps of FIGS. 7-9.

FIGS. 10A and 10B show respective further embodiments of a packaged pressure sensor 30, according to further aspects of the present disclosure. FIGS. 7-9 show steps for manufacturing the packaged pressure sensor 30 of FIG. 10A and 10B. Elements of the packaged pressure sensor 30 that are common to the above described packaged pressure sensors, such as the packaged pressure sensor 1, are designated by the same reference numerals.

In this case, the packaged pressure sensor 30 is the same in structure and function as the packaged pressure sensor 1 of FIGS. 1 and 2, or the packaged pressure sensor 29 of FIG. 5, or the packaged pressure sensor 33 of FIG. 6; however, the pressure sensor 30 of FIGS. 10A and 10B does not have any container 2 or a cap 14. Rather, the outer surface of the package is provided by an encapsulating layer 32, in particular of elastomeric material, which may be any one of the examples provided above in reference to filling layer 12 of FIGS. 1 and 2, or filling layer 31 of FIGS. 5 and 6. In an exemplary embodiment, disclosed in the following, encapsulating layer 32 is of PDMS.

For manufacture of the packaged pressure sensor 30, a sensor chip 6 is used that includes an ASIC 6' and a MEMS pressure sensor 6" of the type already described with reference to FIG. 1. The MEMS sensor is, for instance, of a membrane type, which is exposed and in direct contact with the encapsulating layer 32.

For manufacture of the packaged pressure sensor 30 of FIGS. 10A and 10B, reference is now made to FIGS. 7-9. With reference to FIG. 7, the stack formed by the ASIC 6' and by the MEMS 6" (hereinafter, sensor chip 6) is arranged in a temporary container 34, for example of polycarbonate, Teflon, or steel. To prevent, during the subsequent manufacturing steps, the sensor chip 6 from moving from its position, an adhesive tape 38 may be used for keeping it glued to the bottom of the temporary container 34.

In reference to FIG. 8, PDMS in liquid form and without gas bubbles is poured into the temporary container 34, in a way similar to what has been described with reference to FIG. 1 for covering the sensor chip 6 evenly. A curing step enables solidification of the PDMS to form a filling layer 39 that covers the sensor chip 6 completely.

In reference to FIG. 9, a step of cutting of the temporary container and of the PDMS is carried out along cutting planes parallel to the planes XZ and YZ. By way of example, illustrated in FIG. 9 are cutting lines 40. In this way, the side walls of the temporary container 34 are eliminated. For instance, the cutting planes XZ and YZ are aligned to the perimeter of the ASIC 6'. There is thus formed the encapsulating layer 32 of FIG. 10A.

It is noted that, as a direct consequence of the manufacturing process, a top surface 32a of the encapsulating layer 32 may not be substantially flat; instead, it may have an irregular profile, or a curved profile, or a convex profile. The filling layer 39 may likewise be cut on top, i.e., parallel to the plane XY, to reduce its thickness, if desired, and/or to flatten the top surface 32a. There is thus formed the encapsulating layer 32' of FIG. 10B.

The bottom wall of the temporary container and the layer of adhesive tape are then removed, to obtain the packaged pressure sensor 30 of FIGS. 10A and 10B.

The thickness, along Z, of the PDMS layer is between 0.1 mm and 5 mm, for example 1 mm.

Figure 11:
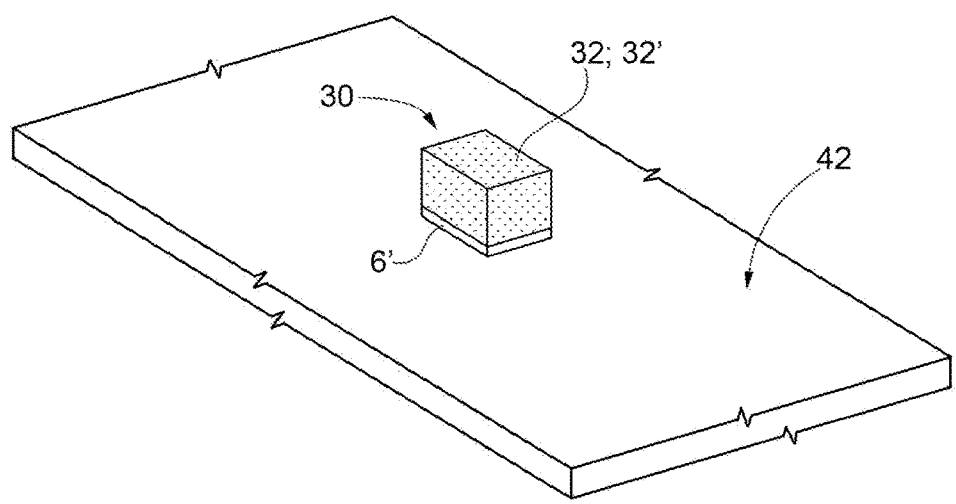
FIG. 11 shows the packaged pressure sensor of FIG. 10A or 10B, which is mounted on a printed-circuit board (PCB) and may be used as pushbutton.

The packaged pressure sensor 30 may be mounted, for example, on a PCB 42 and located in a device for application as pushbutton, as illustrated in FIG. 11, which may be used in a weighing machine, an aid for touchscreens to evaluate the intensity of the pressing force, a sole for a smart shoe, of silicone material, equipped with integrated pressure sensors, and other applications still.

Figure 12:
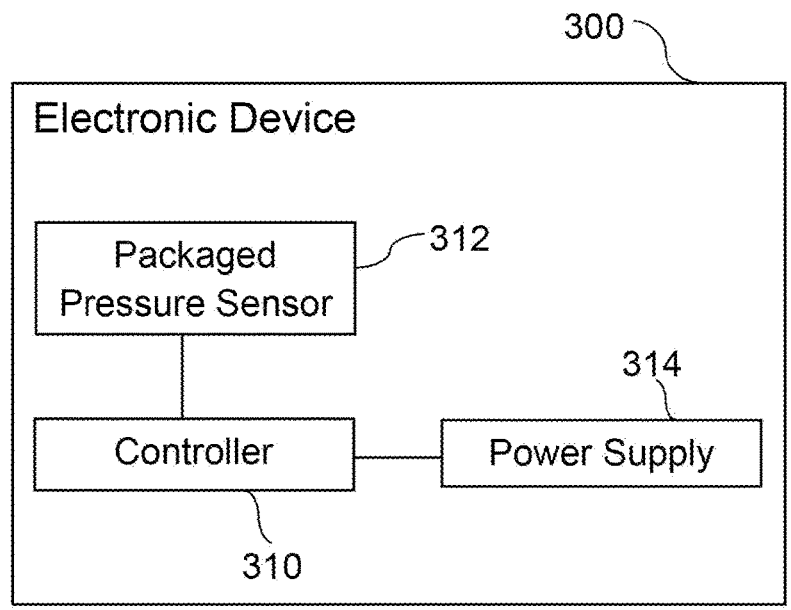
FIG. 12 is a block diagram for an electronic device comprising a package pressure sensor according to one aspect of the present disclosure.

Furthermore, the packaged pressure sensor 30 may likewise be used for providing buttons in electronic devices, such as cellphones, wearable devices, etc. Such an electronic device 300 is shown in FIG. 12, which includes a controller 310 and a packaged pressure sensor assembly 312, which may include any of the packaged pressure sensors described herein, such as the packaged pressure sensor 10 of FIG. 1, or the packaged pressure sensor 29 of FIG. 5 or the packaged pressure sensor 33 of FIG. 6, or the packaged pressure sensor 30 of FIG. 8A or 8B. The packaged pressure sensor assembly 312 is electrically coupled to the controller. The controller 310 includes control circuitry, which may include one or more processors, memory, and discrete logic. The controller 310 is configured to transmit signal to and receive signals from the pressure sensor assembly 312. As mentioned above, the pressure sensor assembly 312 may be part of an input/output device of the electronic device, such as part of a push button for the electronic device. The electronic device may further include a power supply 314, which may be a battery or components for coupling to an external power source.

Figure 13:
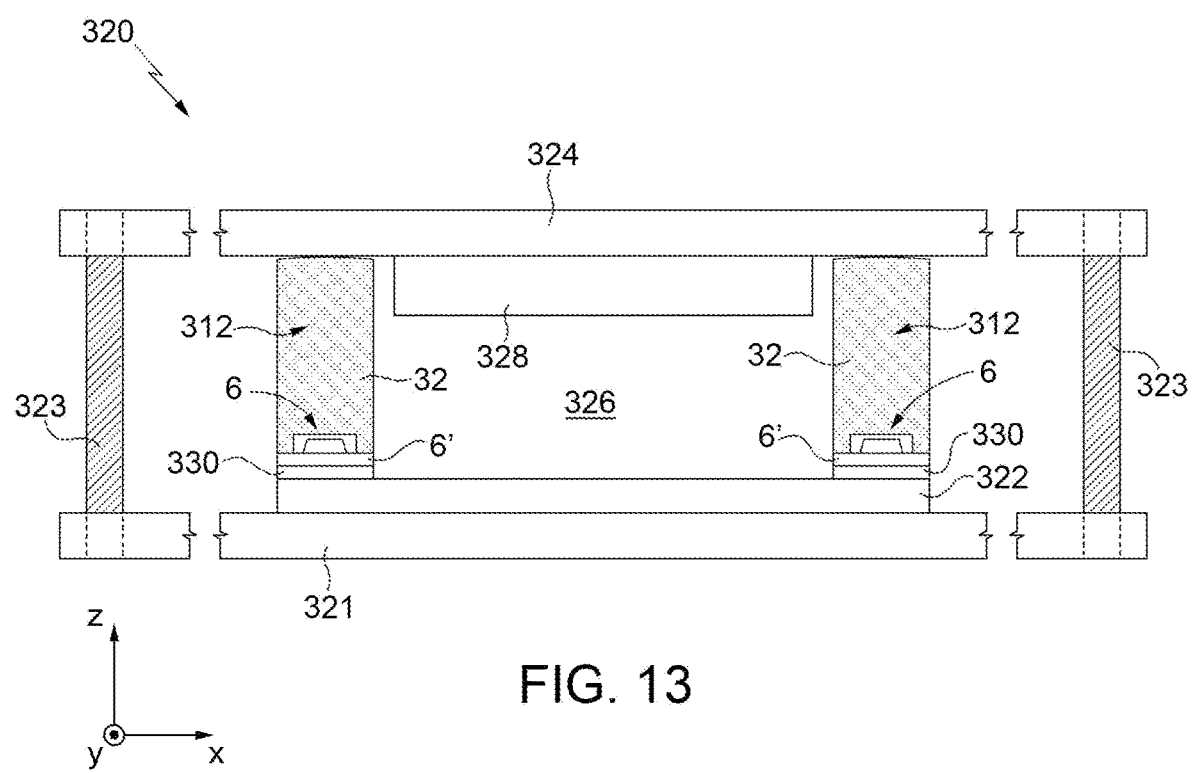
FIG. 13 shows a cross-sectional view of an electronic device housing a packaged pressure sensor according to an embodiment of the present disclosure.

FIG. 13 shows, in a cross-sectional view, a portion of an electronic device 320 provided with a plurality of packaged pressure sensors 312 according to an embodiment of the present disclosure, in particular the packaged pressure sensor 30 of FIG. 10B. It is apparent that the embodiments of the packaged pressure sensor 29 of FIG. 5, of the packaged pressure sensor 33 of FIG. 6, and/or of the packaged pressure sensor 30 of FIG. 10A may be used as well. The electronic device 320 is in particular a cellphone or smartphone, but it can be any other electronic device provided with a touch screen, such as a tablet, a personal computer, an audio player, a wearable device (e.g. a smart watch) and the like. According to further embodiments, the electronic device 320 may be a track-pad, a pointing device (e.g., a touch mouse) or a keyboard (e.g., a touch keyboard. The electronic device 320 may even be part of a smart-pen which can be used to write or draw on a smartphone or tablet. In this case, the electronic device 320 is integrated in the point of the smart pen.

The electronic device 320 comprises a bottom cover 321, which forms a supporting base for a PCB 322, in a per se known manner. The electronic device 320 further comprises a top cover 324 which forms, or includes, a screen of the electronic device 320, typically made of glass. The top cover 324 and the bottom cover 321 are mechanically coupled to one another through coupling elements 323, including, but not limited to, screws, glue, mating connectors or fasteners, or any other suitable coupling elements. The top cover 324 and the bottom cover 321 define, when coupled, an inner space 326. In an embodiment, the top cover 324 and the bottom cover 321 lie on parallel planes.

A touch-sensitive modulus 328 (adapted to sense a touch of a user of the electronic device 320) is housed within the inner space 326, adjacent to the top cover 324. The touch-sensitive modulus 328 is of a per se known type (e.g., it implements a capacitive touch screen) and thus will not be described in detail in the interest of brevity.

Packaged pressure sensors 312, for example four packaged pressure sensor, are located laterally to the touch-sensitive modulus 328, between the PCB 322 and the top cover 324, within the inner space 326. The packaged pressure sensors 312 may be located at the four corners of a rectangular-shaped electronic device 320. In general, the packaged pressure sensors 312 may be in any number other than four, and arranged at other locations of the electronic device 320 between the PCB 322 and the top cover 324, spaced apart from the touch-sensitive modulus 328.

More in detail, each packaged pressure sensors 312 is coupled to the PCB 322 through a respective solder region 330, formed between conductive bottom leads of the ASIC 6' and respective conductive lines of the PCB 322. Each packaged pressure sensors 312 extends towards the top cover 324. In an embodiment of the present disclosure, each packaged pressure sensors 312 is in direct contact with the top cover 324 through the encapsulating layer 32. In another embodiment of the present disclosure, not shown, each packaged pressure sensors 312 may be in contact with the top cover 324 through one or more intermediate layers or spacing elements. The latter solution may be useful in case the packaged pressure sensors 312 are manufactured with an extension, along the Z direction, equal to, or lower than, the thickness, along the Z direction, of the touch-sensitive modulus 328.

During use, a pressure applied on the top cover 324 and directed, at least in part, along Z direction, causes a compression of the encapsulating layer 32 of one or more packaged pressure sensors 312 (depending on the region of the top cover 324 of applied pressure). The encapsulating layer 32 transfers the pressure to the membrane 6c of the respective sensor chip 6, which functions as transducer, converting the deflection undergone by the membrane 6c into a electrical signal processed by the ASIC 6'. Each packaged pressure sensors 312 which is subject to the applied force, therefore, generates an electrical signal indicative of the applied pressure and transfers such electrical signal to the PCB 322, for further processing. In particular, the pressure thus sensed and transduced may be used to provide the electronic device 320 with the further functionality of a pressure-sensitive screen, i.e., the electronic device 320 is not only responsive to the touch of the user in the XY plane (functionality provided by the touch-sensitive modulus 328) but it is also sensitive to the pressure applied by the user on the screen along Z direction. The processing details of the electrical signals supplied by each packaged pressure sensors 312 to the PCB 322 are not part of the present disclosure and therefore not further described.

From what has been described above, various advantages of the disclosure illustrated emerge clearly in the various embodiments.

In particular, embodiments of the present disclosure are simple to produce, presents reduced costs, and enables a wide versatility of practical application.

Finally, it is evident that modifications and variations may be made to the disclosure described, without departing from the scope of the present disclosure. In particular, the dimensions and the embodiments may vary with respect to what has been described for adapting the sensor to the specific scope.

The various embodiments described above can be combined to provide further embodiments. For example, the teachings of FIGS. 3 and 4 may be combined with the teachings of FIGS. 7-9 and 10A, 10B. In this case, the packaged pressure sensor 30 may include a supporting substrate wherein a first MEMS pressure-sensor chip is coupled on a first supporting region, and a second MEMS pressure-sensor chip is coupled on a second supporting region, the first and second supporting regions lying on different planes.

The pressure sensor according to each of the previously disclosed embodiments may be used to sense a pressure, or force, which is uniformly applied on it, as well as a punctual pressure or force applied to a certain (restricted) area of the cap or of the elastomeric encapsulating layer, according to the respective embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A packaged pressure sensor, comprising:
 a MEMS pressure-sensor chip comprising a membrane or a diaphragm; and
 an encapsulating layer of solidified polydimethylsiloxane over the MEMS pressure-sensor chip, the encapsulating layer being configured to transfer a force applied to a surface of the encapsulating layer to the membrane or diaphragm of the MEMS pressure-sensor chip.

2. The packaged pressure sensor according to claim 1, wherein the encapsulating layer is configured to directly receive the force.

3. The packaged pressure sensor according to claim 1, wherein the encapsulating layer is directly exposed to an environment surrounding the packaged pressure sensor.

4. The packaged pressure sensor according to claim 1, wherein the MEMS pressure-sensor chip includes one or more piezoresistive regions.

5. The packaged pressure sensor according to claim 1, further comprising a container having an internal cavity that houses the MEMS pressure-sensor chip, the encapsulating layer filling the internal cavity of the container.

6. The packaged pressure sensor according to claim 5, wherein the container has a first opening and a conductive element extending through the first opening in electrical contact with the MEMS pressure-sensor chip.

7. The packaged pressure sensor according to claim 5, wherein the container has a second opening through which a top surface of the encapsulating layer is exposed, the top surface of the encapsulating layer defining a region of application of the force.

8. The packaged pressure sensor according to claim 7, wherein the encapsulating layer protrudes from the container through the second opening.

9. The packaged pressure sensor according to claim 7, wherein the top surface of the encapsulating layer has a profile that is at least one of curved, convex, and planar.

10. The packaged pressure sensor according to claim 5, wherein the container has a cap in direct contact with the surface of the encapsulating layer, the cap defining a region of application of the force, the cap being configured to deform in response to the force, thereby transferring the force to the encapsulating layer.

11. The packaged pressure sensor according to claim 10, wherein the cap has a first thickness at the first supporting region and a second thickness at the second supporting region, wherein the second thickness is greater than the first thickness.

12. The packaged pressure sensor according to claim 1, wherein the MEMS pressure-sensor chip is a first MEMS pressure-sensor chip and is coupled to a first supporting region, the packaged pressure sensor comprising a second MEMS pressure-sensor chip coupled to a second supporting region, the first and second supporting regions lying on different planes.

13. The packaged pressure sensor according to claim 1, further comprising a printed-circuit board, the MEMS pressure-sensor chip being mounted on the printed-circuit board.

14. An assembly comprising:
 a packaged pressure sensor including:
  a MEMS pressure-sensor chip comprising a membrane or a diaphragm and
  an encapsulating layer of solidified polydimethylsiloxane over the MEMS pressure-sensor chip, the encapsulating layer being configured to transfer a force applied to a surface of the encapsulating layer to the membrane or diaphragm of the MEMS pressure-sensor chip.

15. A system comprising an assembly according to claim 14, wherein the system is at least one of a weighing machine, a touchscreen, a brake system, a smart shoe, a cell phone, a smart phone, a smart-pen, a touch-mouse, a smart watch, a touch-keyboard.

16. An electronic device comprising:
 a case including a bottom cover and a top cover mechanically coupled to the bottom cover;
 a touch-sensitive modulus arranged in the case and configured to sense an in-plane touch command imparted by a user on the top cover,
 at least one packaged pressure sensor arranged in the case and operatively coupled to the top cover, the at least one package pressure sensor including:
  a MEMS pressure-sensor chip comprising a membrane or a diaphragm; and
  an encapsulating layer of solidified polydimethylsiloxane over the MEMS pressure-sensor chip, the encapsulating layer being configured to transfer a force applied to a surface of the encapsulating layer to the membrane or diaphragm of the MEMS pressure-sensor chip,
 wherein the at least one packaged pressure sensor is configured to sense an out-of-plane force imparted by the user on the top cover.

17. The electronic device according to claim 16, wherein said out-of-plane force is a pressure force directed, at least in part, towards the bottom cover.

18. The electronic device according to claim 16, further comprising a printed-circuit board, the at least one packaged pressure sensor being electronically and mechanically coupled to the printed-circuit board.

19. The electronic device according to claim 16, wherein the top cover includes a screen of the electronic device.

20. The electronic device according to claim 16, wherein the packaged pressure sensor is arranged in the case laterally to the touch-sensitive modulus.

21. An electronic device comprising:
a case including a bottom cover and a top cover mechanically coupled to the bottom cover;
a touch-sensitive modulus arranged in the case and configured to sense an in-plane touch command imparted by a user on the top cover,
a plurality of packaged pressure sensors arranged in the case and operatively coupled to the top cover, the at least one package pressure sensor including:
a MEMS pressure-sensor chip; and
an encapsulating layer of solidified elastomeric material over the MEMS pressure-sensor chip, the encapsulating layer being configured to transfer a force applied to a surface of the encapsulating layer to the MEMS pressure-sensor chip,
wherein the at least one packaged pressure sensor is configured to sense an out-of-plane force imparted by the user on the top cover,
wherein each packaged pressure sensor of the plurality of packaged pressure sensors are arranged in the case laterally to the touch-sensitive modulus, each packaged pressure sensor of the plurality of packaged pressure sensors being operatively coupled to the top cover to sense a respective local pressure component generated by said out-of-plane force imparted by the user on the top cover.

22. The electronic device according to claim 21, further comprising a printed-circuit board, wherein the plurality of packaged pressure sensors are electronically and mechanically coupled to the printed-circuit board.

23. The electronic device according to claim 21, wherein said out-of-plane force is a pressure force directed, at least in part, towards the bottom cover.

\* \* \* \* \*